United States Patent [19]

Kumazawa et al.

[11] Patent Number: 5,569,960
[45] Date of Patent: Oct. 29, 1996

[54] ELECTRONIC COMPONENT, ELECTRONIC COMPONENT ASSEMBLY AND ELECTRONIC COMPONENT UNIT

[75] Inventors: Tetsuo Kumazawa, Ibaraki-ken; Makoto Kitano, Tsuchiura; Akihiro Yaguchi, Ibaraki-ken; Ryuji Kohno, Ibaraki-ken; Naotaka Tanaka, Ibaraki-ken; Nae Yoneda, Ibaraki-ken; Ichiro Anjoh, Koganei, all of Japan

[73] Assignee: Hitachi, Ltd., Tokyo, Japan

[21] Appl. No.: 438,466

[22] Filed: May 10, 1995

[30] Foreign Application Priority Data

May 16, 1994 [JP] Japan ................................. 6-100443

[51] Int. Cl.$^6$ ................................................. H01L 23/48
[52] U.S. Cl. ........................... 257/738; 257/778; 257/779; 257/786
[58] Field of Search ........................... 257/779, 786, 257/778, 738

[56] References Cited

U.S. PATENT DOCUMENTS 3,871,015 3/1975 Lin et al. ................................. 257/779
5,216,278 6/1993 Lin et al. ................................. 257/688

OTHER PUBLICATIONS

IBM Technical Disclosure Bulletin vol. 28 No. 6 Nov. 1985 p. 2353.

*Primary Examiner*—Mahshid Saadat
*Assistant Examiner*—Roy Potter
*Attorney, Agent, or Firm*—Antonelli, Terry, Stout & Kraus

[57] ABSTRACT

An electronic component unit is provided with two electronic components which are disposed in parallel with each other and each of which has an internal electric circuit therein. Electrode pads are provided on the opposed surfaces of the two electronic components and are electrically connected to the internal electric circuits. The pads on one of the electronic components are respectively electrically and mechanically connected to the corresponding pads on the other electronic component by solder bumps. The areas of the pads increase or decrease stepwise in the direction from the central portions toward the outer peripheral edges of the two electronic components, while the volumes of the solder bumps are constant. Alternatively, the volumes of the solder bumps decrease or increase in the direction from the central portions toward the outer peripheral edges of the two electronic components, while the areas of all pads are constant. Each of the pads of the two electronic components is bonded to an associated solder bump over the whole area of the pad, whereby the shapes of the solder bumps respectively connected to the pads of the two electronic components change in the direction from the central portions toward the outer peripheral edges of the two electronic components to provide the solder bumps with different durabilities to stress, thereby assuring high reliability of the connection between the two electronic components.

38 Claims, 4 Drawing Sheets

ELECTRONIC COMPONENT, ELECTRONIC COMPONENT ASSEMBLY AND ELECTRONIC COMPONENT UNIT

BACKGROUND OF THE INVENTION

1. Field of the Invention

The present invention relates to an electronic component having at least two electrode pads on a surface thereof, an assembly comprising such electronic component and metallic soldering elements usually called "solder bumps", and an electronic component unit comprising such electronic component and another electronic component.

2. Description of the Prior Art

In the conventional method of bonding a semiconductor device to a substrate with solder bumps disposed therebetween, as disclosed in U.S. Pat. No. 5,216,278, the bumps are formed on the semiconductor device at predetermined intervals, electrode pads to be soldered are of the same area, and balls for forming the bumps are of the same size. In the conventional method, a semiconductor device having such a junction structure is bonded to a circuit substrate regardless of warpage of the substrate on which electrode pads are also formed, and also regardless of expansion characteristics of the substrate.

FIGS. 8 and 9 show an example of electronic component units comprising a semiconductor package and a circuit substrate which are connected by the above conventional method, In these drawings, a semiconductor element 1 is mounted on a base 3 and electrically connected to top electrodes 5a of the base 3 by wires 4. The top electrodes 5a of the base 3 are respectively electrically connected to bottom electrodes 5b. The semiconductor element 1, the wires 4 and the base 3 are sealed with a resin 5. Insulating resist 2 is coated on the lower side of the base 3. The surfaces of the lower surface electrodes 5b of the base 3 have portions without the resist 2 which respectively form electrode pads 6. Solder balls 8 are respectively adhered to the pads 6.

On the other hand, resist 2a is coated on the surface of a substrate 9, and the surfaces of electrodes 10 in the substrate 9 have portions without the resist 2a, which respectively form electrode pads 7. The semiconductor package is mounted on the substrate 9 by melting the solder balls 8 by heat and bonding the balls to the pads 7.

A structure electrically connecting a semiconductor package to a circuit substrate via solder bumps exhibits excellent high-speed electrical processing because the wiring length is decreased by an amount corresponding to the lead length and, thus, conforms to a multi-pin structure and the use of multiple pins because many bumps can be formed, as compared with the connection to a circuit substrate through leads. In this bump connection structure, the bump arrangement area is decreased and the packaging density of the package is increased as the diameter of each solder bump is decreased. The suitable size of each bump, therefore, is considered to be 500 to 700 μm. However, a decrease in size of the bumps causes an increase in cost due to the need for advanced bonding technology, and cause a significant decrease in the strength reliability of the bumps. The problem with respect to the reliability is considered particularly significant partly because the difference in thermal expansion between a substrate on which a chip is mounted and a circuit substrate is accommodated by the solder bumps having a low strength. This is also because warpage invariably remains in the substrate, and the warped substrate is bonded to the circuit substrate, so that tensile loads are apt to be applied to the bumps.

SUMMARY OF THE INVENTION

It is an object of the present invention to solve the above problems of the prior art and to provide a bump connection structure with high reliability.

According to a first feature of the present invention, there is provided an electronic component unit comprising:

a first electronic component having an internal electric circuit therein;

a second electronic component having an internal electric circuit therein and disposed in substantially parallel relationship to said first electronic component;

at least two electrode pads provided on a surface of said first electronic component facing said second electronic component and electrically connected to the internal electric circuit of said first electronic component, one of said at least two pads being disposed adjacent a central portion of said first electronic component, the other pad being disposed adjacent an outer peripheral edge of said first electronic component;

at least two electrode pads provided on a surface of said second electronic component facing said first electronic component, said at least two pads being respectively disposed substantially in alignment with the pads of said first electronic component; and metallic bonding elements disposed between said first and second electronic components for electrically and mechanically connecting together the respective pads of said first electronic component and the pads of said second electronic component;

the ratio of the surface area of one of the pads of at least one of said first and second electronic components to the volume of the metallic bonding element connected to said one pad is different from the ratio of the surface area of the other pad of said one electronic component to the volume of the metallic bonding element connected to said other pad;

each of the pads of said first and second electronic components being bonded to an associated metallic bonding element over substantially the whole area of the pad, whereby the shape of the metallic bonding element connected to said one pad of at least one of said first and second electronic components is different from the shape of the metallic bonding element connected to said other pad.

According to the electronic component unit of the present invention having the above structure, the shapes of the at least two metallic bonding elements can be selected so that they are suitable for, for example, the thermal expansion characteristics of the electronic component unit, and so that, of the metallic bonding elements respectively connected to the at least two pads of at least one of the two electronic components, the metallic bonding element disposed adjacent the outer peripheral edge of the one electronic component has higher durability to stress than the other metallic bonding element. This contributes to an improvement in the reliability of solder connections for electrically and mechanically connecting the two electronic components.

In an electronic component unit in accordance with a preferred embodiment of the present invention, the surface area of the one pad of the at least one of the electronic components is different from the surface area of the other pad, and the volume of the metallic bonding element connected to the one pad of the at least one of the electronic components is substantially the same as the volume of the metallic bonding element connected to the other pad.

In the electronic component unit, the surface area of the one pad may be either greater or smaller than the surface area of the other pad.

In an electronic component unit in accordance with another preferred embodiment of the present invention, the surface area of the one pad of the at least one of the electronic components is substantially the same as the surface area of the other pad, and the volume of the metallic bonding element connected to the one pad of the at least one of the electronic components is different from the volume of the metallic bonding element connected to the other pad.

In each of the electronic component units in accordance with both embodiments, the first electronic component may be a semiconductor package comprising a substrate and a semiconductor chip, the substrate having first and second surfaces, the at least two pads being provided on the first surface, and the semiconductor chip being mounted on the second surface. The second electronic component is a circuit substrate.

Alternatively, in the electronic component unit, the first electronic component may be a semiconductor chip and the second electronic component may be a substrate.

In the electronic component unit of the present invention, each of the first and second electronic components may preferably have at least three pads. In this case, the pad intervals may be different or changed from the central portions toward the outer peripheral edges of the electronic components.

Each of the metallic bonding elements preferably comprises a solder material containing at least one metal selected from the group consisting of Pb, Sn, Ag, Au, In and Sb.

The metallic bonding element connected to the one pad of the at least one of the first and second electronic components may comprise a solder material having a melting point different from that of the solder material of the metallic bonding element connected to the other pad.

Each of the pads may preferably have a two layer structure comprising a Ni layer and an Au layer.

In the electronic component unit of the present invention, the first electronic component may preferably have many pads including the at least two pads, the many pads being respectively disposed at intersections of phantom longitudinal and lateral lines which form a lattice pattern, and the second electronic component may have many pads disposed substantially in alignment with the pads of the first electronic component. The ratios of the areas of the pads to the volumes of the metallic bonding elements may preferably change in the direction from the central portions toward the outer peripheral edges of the electronic components.

The ratios of the areas of the pads to the volumes of the metallic bonding elements may increase or decrease in the direction from the central portions toward the outer peripheral edges of the electronic components.

In accordance with a second feature of the present invention, there is provided an electronic component having an internal electric circuit therein and adapted to be electrically and mechanically connected to another electronic component through metallic bonding elements, said component having:

a surface to be connected to said another electronic component; and at least two pads electrode disposed on said surface and electrically connected to said internal electric circuit;

each of said at least two electrode pads having a surface having a property of being wetted with a molten metal of said metallic bonding elements;

said at least two electrode pads being adapted to be electrically and mechanically connected to said another electronic component through said metallic bonding elements;

one of said at least two pads being disposed adjacent a center of said surface, the other pad being disposed adjacent an outer edge of said surface; and the surfaces of said at least two pads having different areas.

Therefore, if solder balls used for forming the metallic bonding elements respectively connected to the pads have the same volume and are melted to form bumps, the resultant shapes of the bumps are different from each other. This consequently provides advantages the same as those obtained from the first feature of the present invention.

In the electronic component, the surface area of the one pad may be either greater or smaller than the surface area of the other pad.

Each of the pads may preferably have a two layer structure comprising a Ni layer and an Au layer.

Many pads including the at least two pads may preferably be provided on the surface, the many pads may be respectively disposed at intersections of phantom longitudinal and lateral lines which form a lattice pattern, and the pad interval may vary in the direction from the central portion toward the outer peripheral edge of the surface.

In accordance with a third feature of the present invention, there is provided an electronic component assembly comprising:

an electronic component having an internal electric circuit therein;

at least two electrode pads electrically connected to said internal electric circuit and provided on a surface of said electronic component so as to be connected to another electronic component, one of said at least two pads being disposed adjacent a center of said surface, the other pad being disposed adjacent an outer edge of said surface; and metallic bonding elements respectively disposed on said at least two pads to form bumps;

said at least two pads having surfaces having a property of being wetted with a molten metal of the metallic bonding elements; and the ratio of the area of said one pad to the volume of the metallic bonding element connected to said one pad being different from the ratio of the area of said other pad to the volume of the metallic bonding element connected to said other pad.

This structure of the present invention also provides advantages the same as those obtained from the first and second features of the present invention.

In the electronic component assembly, the electronic component may be a semiconductor package comprising a substrate and a semiconductor chip, the substrate may have first and second surfaces, the at least two pads may be provided on the first surface, and the semiconductor chip may be mounted on the second surface.

Alternatively, in the electronic component assembly, the electronic component may be a semiconductor chip and the at least two pads may be provided on a surface of the semiconductor chip.

In the electronic component assembly, the electronic component may be a substrate and the at least two pads may be provided on a surface of the substrate.

In the electronic component assembly, the surface area of the one pad may be different from the surface area of the other pad.

In the electronic component assembly, the volume of the metallic bonding element connected to the one pad may be substantially the same as the volume of the metallic bonding element connected to the other pad.

In an electronic component assembly in accordance with a preferred embodiment of the present invention, at least three pads are provided on the surface, and the pad interval changes in the direction from the central portion toward the outer peripheral edge of the surface.

In the electronic component assembly, each of the metallic bonding elements may comprise a solder material containing at lest one metal selected from the group consisting of Pb, Sn, Ag, Au, In and Sb.

In the electronic component assembly, the metallic bonding element disposed on the one pad may comprise a solder material having a melting point different from the melting point of the solder material of the metallic bonding element disposed on the other pad.

In the electronic component assembly, each of the pads may have a two layer structure comprising a Ni layer and an Au layer.

In the electronic component assembly, many pads including the at least two pads may preferably be provided on the surface, the many pads may be respectively provided on the intersections of phantom longitudinal and lateral lines which form a lattice pattern, and the ratios of the areas of the pads to the volumes of the metallic bonding elements may change in the direction from the central portion toward the outer peripheral edge of the surface. The ratios of the areas of the pads to the volumes of the metallic bonding elements may increase in the direction from the central portions toward the outer peripheral edges of the electronic components, or may decrease in the direction from the central portion toward the outer peripheral edge of the surface.

The above and other objects, features and advantages of the present invention will be made more apparent from the description of preferred embodiments with reference to the drawings.

DESCRIPTION OF THE PREFERRED EMBODIMENTS (Embodiment 1)

Figure 1:
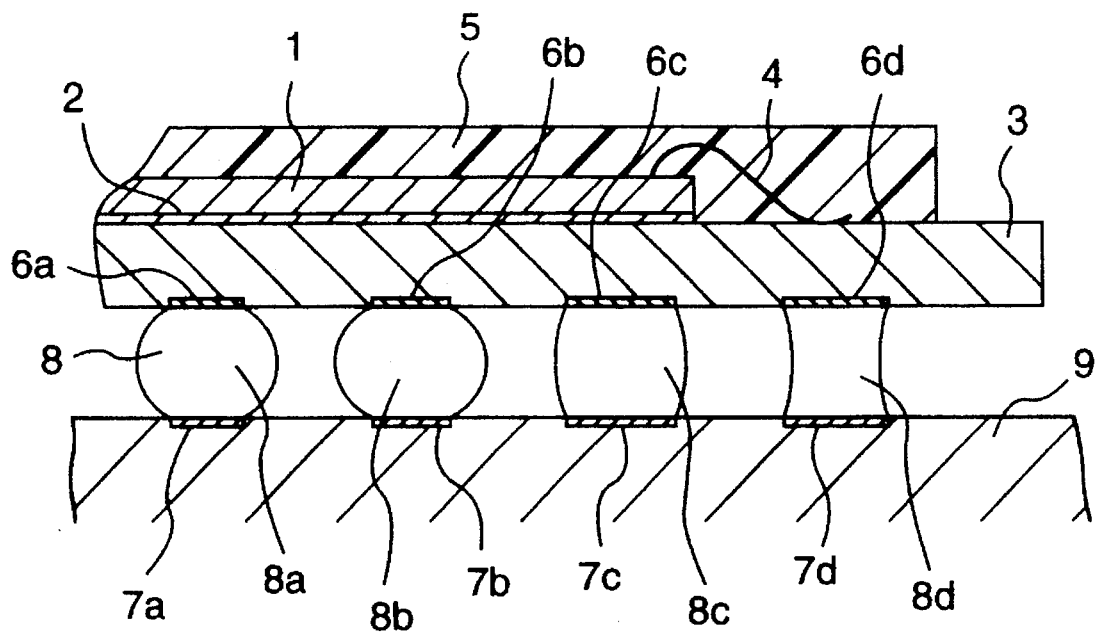
FIG. 1 is a fragmentary sectional view of an electronic component unit in accordance with an embodiment of the present invention.

FIG. 1 is a sectional view of a semiconductor device in accordance with an embodiment of the present invention. In FIG. 1, a semiconductor chip 1 is bonded by a bonding agent 2 to a wiring surface of a substrate 3 having electrical wiring formed thereon. An insulating paste is used as the bonding agent 2. The substrate 3 comprises a plate of glass fiber/ epoxy resin material on which two to ten electric wiring layers are provided. Alternatively, the substrate 3 may comprise paper/phenolic resin.

Pad wires 4 on the semiconductor chip 1 are connected to upper electrodes of the substrate 3 by bonding. Each of the wires 4 comprises a gold or aluminum wire having a diameter of 25 or 30 μm. The wires 4 and the semiconductor chip 1 are protected by resin bonding or sealed by embedding them in a molded resin 5. Electrical signals are supplied from the semiconductor chip 1 to the electrodes of the substrate 3 through the wires 4 and reach lower electrode pads 6 through layered wiring in the substrate serving as conduction portions. Each of the pads 6 forms a bump forming region.

Figure 2:
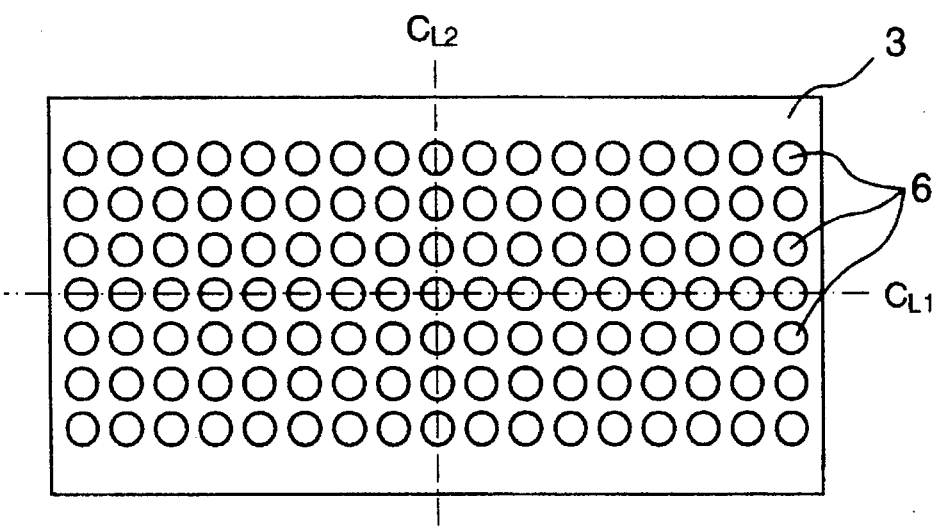
FIG. 2 is a bottom view of a semiconductor package of the electronic component unit shown in FIG. 1, showing electrode pads provided on the bottom of the package.

As shown in FIG. 2, the electrode pads 6 are disposed at equal intervals of 1.3 mm on intersections of phantom longitudinal and lateral lines which form a lattice. The pads 6 are each formed preferably by forming a Ni plated layer on a Cu wiring of the substrate and then forming an Au plated layer on the Ni layer. With the pad interval of 1.3 mm, the pads 6 are of a circular shape and have diameters which vary from 0.4 mm to 0.65 mm in seven stages with an increment of 0.05 mm in the direction from the center to the outer edge of the substrate 3. Returning to FIG. 1, solder balls 8 are respectively disposed on the thus formed pads 6 to form bumps. In this embodiment, each of the solder balls used for forming the electrode bumps has a diameter of 0.6 mm.

The pads of the substrate are bonded to electrodes pads 7 (bump forming regions) on a large circuit substrate 9 for mounting (mounting substrate) by melting the solder balls 8. Each of the pads 7 on the circuit substrate 9 defines a circular region having the same size as that of the pad 6 disposed in opposite relationship thereto on the substrate 3.

The solder balls 8 are previously arranged in a cassette corresponding to the arrangement of the pads 6 of the substrate 3 and then are transferred to the lower side of the substrate 3 to which solder paste is coated. Since the paste coated on the pads 6 alone has viscosity, the solder balls 8 are provisionally fixed to predetermined positions of the substrate 3, i.e., to the pads 6.

Figure 3:
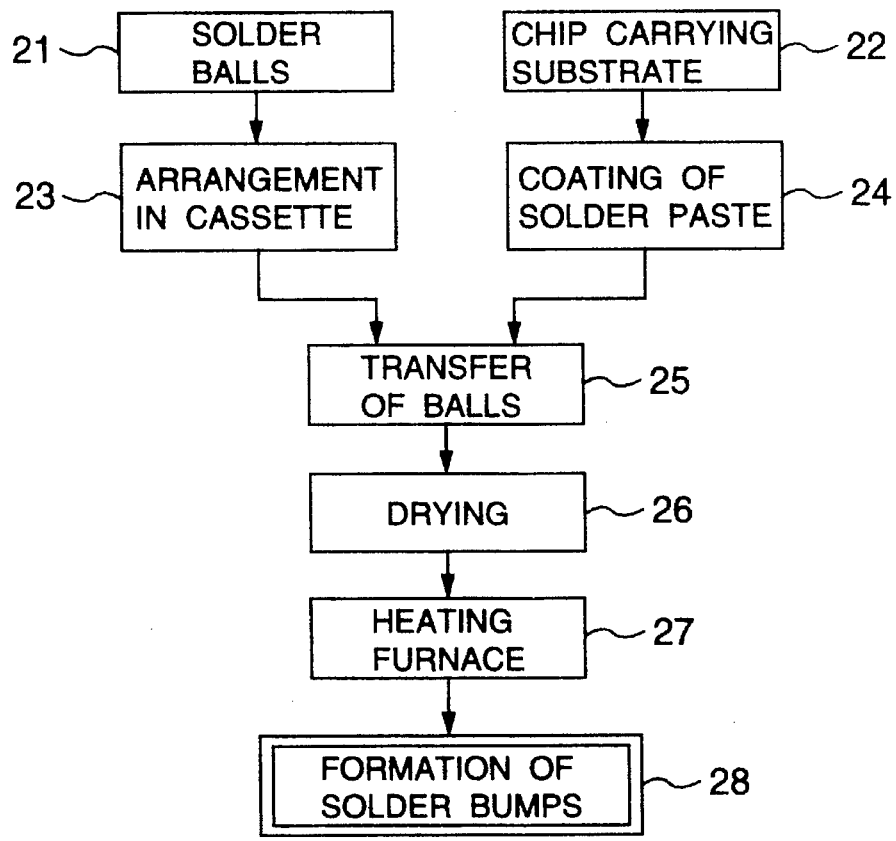
FIG. 3 is a flow chart showing the process of forming solder bumps on the pads.

FIG. 3 is a flow chart showing a typical process of bonding the solder balls used in the present invention. Namely, the solder balls 8 are prepared in Step 21 and then arranged in a cassette in Step 23. On the other hand, a solder paste is coated in Step 24 on the chip mounting substrate 3 prepared in the Step 22. The solder balls 8 are then transferred to the substrate 3 (Step 25), followed by drying (Step 26) and heating in a furnace (Step 27) to form bumps (Step 28). Thereafter, the electrode pads 7 of another component (circuit substrate 9) to be bonded are aligned to and bonded to the balls 8 on the substrate 3, i.e., the thus formed bumps. A body to be bonded is not limited to the substrate 3, and the balls may be transferred to any bodies to be bonded (Step 25).

This bonding is performed by placing the substrate 3, having the bumps formed by the solder balls 8 on the lower side thereof, and the circuit substrate 9 such that the bumps 8 on the substrate 3 respectively contact the pads 7 of the circuit substrate 9 to form an assembly, heating the assembly in a reflow furnace at a temperature higher than the melting point of the solder bumps to re-flow the solder, taking out the assembly from the furnace and then cooling the assembly.

In the embodiment shown in FIG. 1, as described above, the electrode pads 6 on the lower surface of the substrate 3 have circular shapes, and the areas of the pads decrease stepwise in the direction from the center (the point of the intersection of longitudinal and widthwise center lines $C_{L1}$ and $C_{L2}$ shown in FIG. 2) to the outer edge of the substrate 3. On the other hand, since the solder balls 8 used for forming the bumps have substantially the same diameters, the volumes of the solder balls which adhere to all pads 6 of the substrate 3 are substantially the same. Further, the surfaces of the electrode pads 6 of the substrate 3 which respectively form the bump forming regions comprise Au films and thus have a property of being easily wetted with melted solder. The areas and wettability of the electrode pads 7 formed on the surface of the circuit substrate 9 are the same as those of the pads 6. For these reasons, when the assembly is heated to a temperature higher than the melting point of the solder bumps 8, the solder bumps are melted and respectively adhered and bonded to all areas of the pads 6 respectively associated with the bumps as well as to all areas of the pads 7 respectively associated with the pads 6. However, the melted solder is not adhered to portions of the surfaces of the substrate 3 and the circuit substrate 9 where the electrode pads 6 and 7 are absent. Since the area of the pad 6d adjacent to the outer edge of the substrate 3 is greater than the area of the pad 6a in the central portion of the substrate 3, the amount of the melted solder adhered to the pad 6d is greater than the amount of the melted solder adhered to the pad 6a. Similarly, the amount of the melted solder adhered to the pad 7d adjacent to the outer edge of the circuit substrate 9 is greater than that the pad 7a in the central portion of the substrate 9. The thus-formed bump 8d has a shape (a so-called "hand drum shape") in which the diameter of the central portion in the vertical direction is smaller than the diameter of each of the pads 6d and 7d. Each of the bumps 8a respectively adhered to the pads 6a in the central portion of the substrate 3 has a shape (a shape close to a sphere) in which the diameter of the central portion in the vertical direction is greater than the diameter of each of the pads 6 and 7. Each of the bumps 8b and 8c adhered to the pads 6b and 6c has a shape intermediate the shapes of the bumps 8a and 8d.

Figure 4:
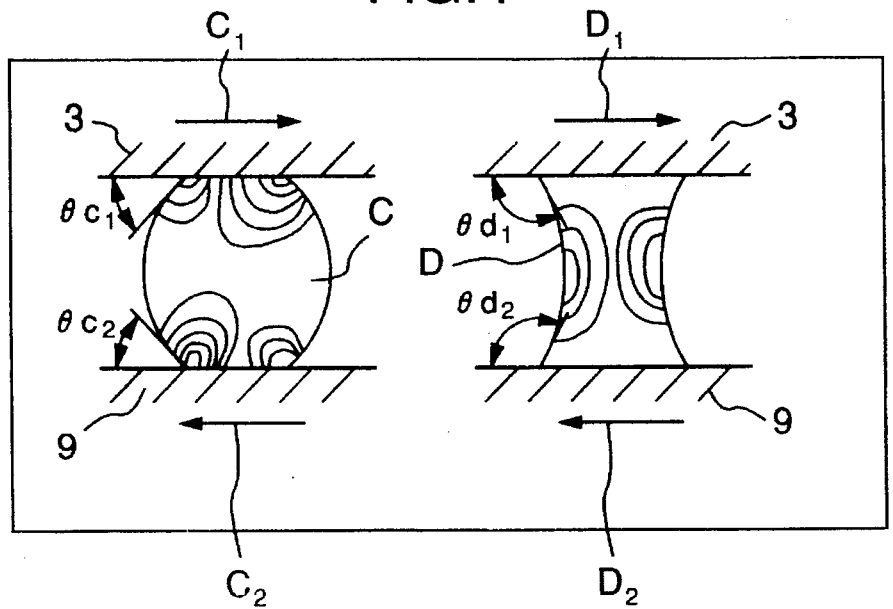
FIG. 4 is a drawing illustrating the concentrations of stresses caused in solder bumps having different shapes.

The relation between the shape of a bump and the life (durability to stress) is described below with reference to FIGS. 4 and 5. FIG. 4 shows bumps C and D as examples. The contact angles of bump C with respect to the substrate 3 and the circuit substrate 9 are designated by $\theta_{c1}$ and $\theta_{c2}$, respectively, while the contact angles of bump D with respect to the substrate 3 and the circuit substrate 9 are designated by $\theta_{d1}$ and $\theta_{d2}$, respectively. As is apparent from FIG. 4, the contact angles $\theta_{c1}$ and $\theta_{c2}$ are smaller than the contact angles $\theta_{d1}$ and $\theta_{d2}$, respectively.

The substrate 3 and the circuit substrate 9 expand with heat, the amounts of the thermal expansions of the substrate 3 and the circuit substrate 9 are different because the thermal expansion coefficients thereof are different. The relative displacement between the substrate 3 and the circuit substrate 9 due to the difference in thermal expansion therebetween causes stresses in all bumps. For the bump C having the smaller contact angles θ with respect to the substrates 3 and 9, the stresses caused by the relative displacement are concentrated in the corners of the junctions between the bump C and the substrates 3 and 9, thereby easily damaging the bump C and the junctions between bump C and the substrates 3 and 9. On the other hand, for the bump D having the relatively larger contact angles θ, the stress is concentrated in the central portion (an intermediate portion between the substrates 3 and 9) of the bump D as viewed in the vertical direction thereof. The more the shape of a bump is close to a hand drum shape, the more the stress is concentrated in the central portion of the bump as viewed in the vertical direction thereof.

Figure 5:
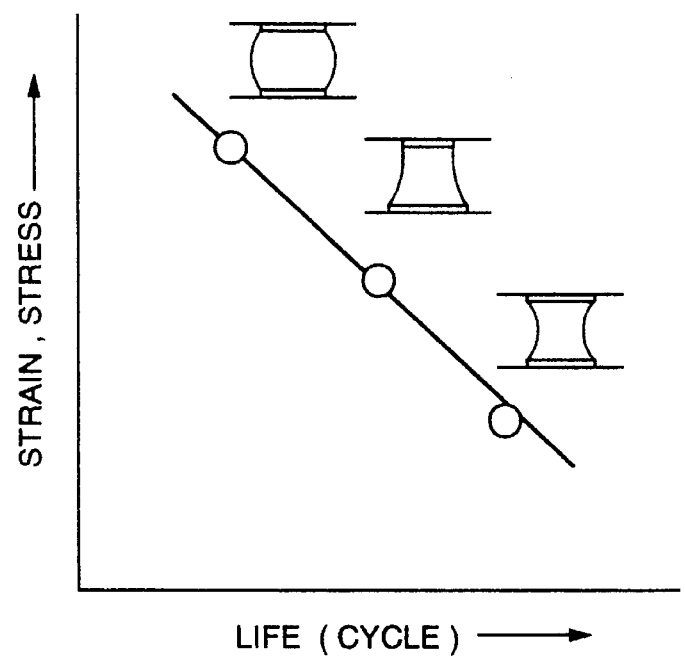
FIG. 5 is a graph showing the relation between the shapes of bumps and the temperature cycle lives thereof.

FIG. 5 shows the relation between strain and stress in bumps of various shapes and the temperature cycle lives of the bumps. This relation was obtained when various bumps were subjected to relative displacements of the same amounts. As is apparent from FIG. 5, assuming that the relative displacements applied to the bumps are the same, the operative lives of the bumps increase, and the reliability of solder junctions thus increase, as the shapes of the bumps change from a spherical shape to a hand drum shape.

The relative displacement between the substrates 3 and 9 due to the-difference in the thermal expansion is small in the central portions of these substrates, while the relative displacement is large in the portions of the two substrates adjacent the outer edges thereof. In FIG. 4, arrows $C_1$ and $C_2$ indicate a relative displacement caused between the substrates 3 and 9 due to the difference in the thermal expansion which is applied to the bump C, and arrows $D_1$ and $D_2$ indicate a relative displacement caused between the substrates 3 and 9 due to the difference in the thermal expansion which is applied to the bump D. Since the bump D is more distant from the central portions of the substrate 3 and the circuit substrate 9 (i.e., portions having substantially no relative displacement due to the difference in the thermal expansion between the substrate 3 and the circuit substrate 9) than the bump C is, i.e., bump D is closer to the outer edges of the substrates 3 and 9, the relative displacement $D_1$–$D_2$ is greater than the relative displacement $C_1$–$C_2$. This is true with the embodiment of the present invention shown in FIG. 1. Namely, in the embodiment shown in FIG. 1, the relative displacement between the substrates 3 and 9 increases in the direction from the central portions of the substrates 3 and 9 (portions with substantially no relative displacement due to the difference in the thermal expansion therebetween) toward the outer edges thereof. Therefore, the stresses caused in the bumps adjacent the outer edges of the substrates 3 and 9 are greater than the stresses caused in the bumps adjacent the central portions thereof. However, since the shapes of the bumps 8 change from spherical to a hand drum shape in the direction from the central portions of the substrates 3 and 9 toward the outer edges thereof, the bumps adjacent the outer edges can resist larger stress and relative displacement.

The solder junctions, i.e., the bumps 8, serve as means for electrically connecting the circuit substrate 9 and the substrate 3 of the semiconductor chip package. However, since stresses are caused in the connecting means due to thermal deformation of the two substrates 3 and 9, the reliability in respect of strength of the connecting means is considered most significant. In the solder junctions according to the present invention, since the bumps in which larger stresses are caused have higher durability, as described above, the durability of the solder junctions as a whole between the two substrates is improved, with an increase in reliability, as compared with the conventional solder junctions. The present invention thus permits a practical use of a high-performance semiconductor package suitable for multi-pin packaging and high-speed processing.

In addition, in solder-mounting of packages such as QFP (Quad Flat Package), SOP (Small Outline Package), BGAP (Ball Grid Array Package), etc., it was difficult to prepare bumps having different shapes in a single package for decreasing stress. However, the present invention can easily change the shapes of bumps in a component of a BGAP without using a special jig or apparatus and, thus, enables the advantageous practical use of the BGAP as a multi-pin, package which can be made at high speed.

It is also possible to ensure amounts of solder necessary for forming bumps by applying thick layers of solder to the pads by a printing method in place of the use of the solder balls 8. A substrate 3 to which solder is thus applied and a circuit substrate 9 are placed opposite to each other and soldered through a re-flow process to form a solder connection. In this connection structure, each of the bumps adjacent the outer peripheries of the substrates has a hand drum shape.

Some semiconductor packages are liable to warp in an angular manner (the central portion is projected upwardly) according to the internal structures thereof. In such a case, since the circuit substrate 9 has rigidity and is flat, tensile loads more easily occur in the bumps in the central portion of the package. Therefore, the pads in the central portion of the package are made larger than the pads adjacent the outer periphery of the package so that each of the bumps in the central portion of the package has a hand drum shape.

In regard to the relations among the areas of the pads 6 of the substrate 3, the areas of the pads 7 of the circuit substrate 9 and the diameters of the solder balls 8, the areas of the pads 7 of the circuit substrate 9 may be varied, while the sizes of the pads 6 of the substrate 3 and the diameters of the balls 8 are constant. Alternatively, the diameters of the solder balls 8 may be varied while the areas of the pads 6 of the substrate 3 and the areas of the pads 7 of the circuit substrate 9 are constant. Further, the sizes of the pads 6 of the substrate 3 may be different while the areas of the pads 7 of the circuit substrate 9 and the diameters of the solder balls 8 are constant.

(Embodiment 2)

Figure 6:
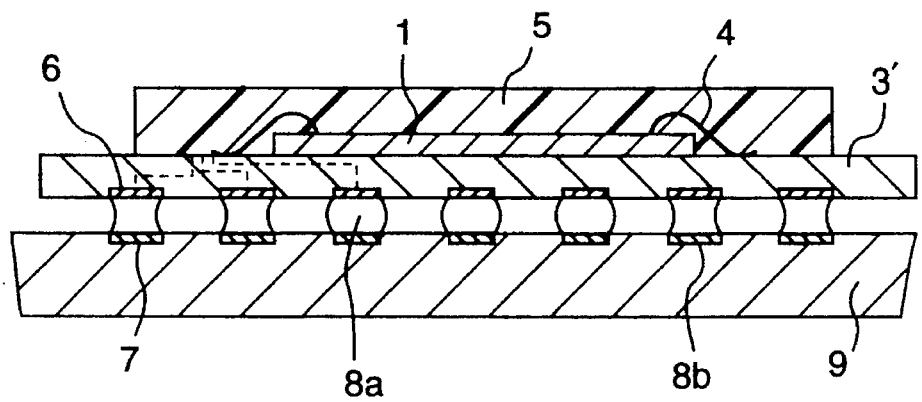
FIG. 6 is a sectional view of an electronic component unit in accordance with another embodiment of the present invention.

FIG. 6 is a sectional view of a semiconductor device in which, after wire bonding, a semiconductor chip 1 is die-bonded to a substrate 3' of a biphenyl resin and then sealed in a resin 5. In FIG. 6, electric signals are passed through internal layer wiring of the substrate 3' to lower electrode pads 6. The pads 6 are arranged at equal intervals of 1.3 mm at intersections of phantom lines which form a lattice pattern. When the interval of the pads 6 is 1.3 mm, each of the pad regions has a circular form. The diameters of the pads disposed within a region of the substrate 3' which is inward of the midway between the center and the outer edge of the substrate are each 0.5 mm, and the diameters of the pads within the outer half area of the substrate are each 0.6 mm. Each of solder balls 8a used for forming bumps has a diameter of 0.6 mm. Each of the solder balls 8a adjacent the center of the substrate 3' comprises Sn/Ag (95/5) and has a melting point 221° C., while each of the solder balls 8b adjacent the outer edge comprises Sn/Pb (60/40) and has a melting point 183° C. The solder balls 8 are all previously arranged in a cassette corresponding to the arrangement of the pads 6 of the substrate and then are transferred to the substrate 3' to which paste is applied. The substrate 3' to which the solder balls 8 are applied and the circuit substrate 9 are placed opposite to each other and then soldered together through a re-flow process.

When the substrates 3 and 9 which are placed one on the other are slowly taken out from the reflow furnace, the solder (Sn/Ag: 95/5) having the higher melting point is first solidified and the solder (Sn/Pb: 60/40) having the lower melting point is then solidified.

There is no difficulty in use of solder containing In and Sn as the solder materials having different melting points. When solder materials having different melting points are used, the diameters of balls of different solder materials may be varied, while the areas of the pads 6 of the substrate and the areas of the pads of the circuit substrate 9 are constant. Alternatively, the areas of the pads of the substrate 3' and the areas of the pads of the circuit substrate 9 may be varied, while the diameters of the balls of different solder materials are constant.

(Embodiment 3)

Figure 7:
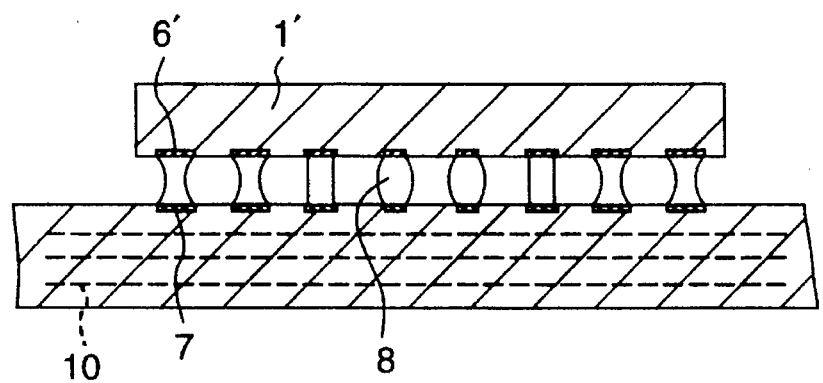
FIG. 7 is a sectional view of an electronic component unit in accordance with a further embodiment of the present invention.
Figure 8:
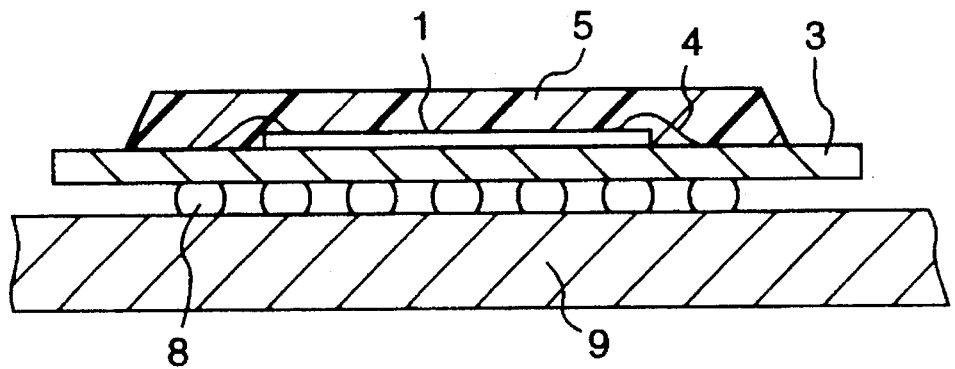
FIG. 8 is a sectional view of the electronic component unit provided with solder junction portions formed by the conventional method.
Figure 9:
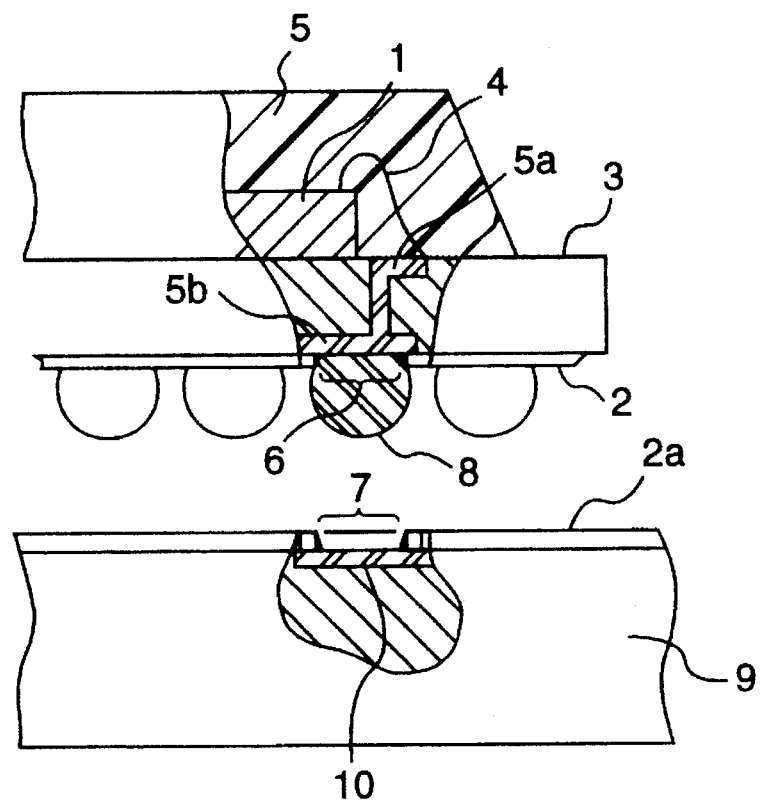
FIG. 9 is an enlarged fragmentary partial sectional view of a portion of the electronic component unit shown in FIG. 8.

FIG. 7 is a sectional view showing a state where an Si chip 1' is directly mounted on a ceramic four-layer wiring substrate 10 and connected thereto. The Si chip 1' contains functional units for operation, memory and control which are connected by a wiring network. Pads 6' at the wiring end are arranged in a lattice pattern. The pads 6' are formed by laminating thin metallic films and applying an Au film to the outermost layer of the laminated films. Each of the pad regions in the central portion of the chip 1' has a rectangular form of 60 μm×60 μm, the sizes of the pad regions being changed stepwise in the direction from the central portion toward the outer edge of the chip 1'. Each of the solder balls 8 has a composition consisting of Pb/Sn: 5/95 and a diameter of 60 μm. These solder balls were arranged in a cassette corresponding to the positions of pads 7 of the substrate 10. The sizes of the pads 7 of the substrate 10 respectively correspond to the pads 6' of the chip 1'. After the substrate 10 and the cassette are placed opposite to each other, they are put in a furnace for melting the solder balls to transfer the solder to the pads 7 of the ceramic substrate 10. The Si chip 1' with the pads 6' is then placed on the substrate 10, and they are bonded.

There is no difficulty in use of two or three types of balls having different melting points, rather than balls comprising a single material, as the solder balls 8 for forming bumps. In some cases, the sizes of the pads 7 of the substrate 10 and the pads 6' of the chip 1' may be constant, or they may change stepwise, or the areas of the pads 7 of the substrate 10 may be about 1.5 times as large as the areas of the pads 6' of the chip 1'.

What is claimed is:

1. An electronic component unit comprising:

a first electronic component having an internal electric circuit therein;

a second electronic component having an internal electric circuit therein and disposed in substantially parallel relationship to said first electronic component;

at least five electrode pads provided on a surface of said first electronic component facing said second electronic component and electrically connected to the internal electric circuit of said first component, one of said at least five pads on said first electronic component being disposed adjacent a central portion of said first electronic component, two of said at least five pads on said first electronic component being disposed adjacent opposite outer peripheral edges of said first electronic component, and the remainder of said at least five pads on said first electronic component being successively disposed between said two of said at least five pads on said first electronic component;

at least five electrode pads provided on a surface of said second electronic component facing said first electronic component, said at least five pads being respectively disposed substantially in alignment with the at least five pads of said first electronic component; and at least five discrete metallic bonding elements disposed between said first and second electronic components for electrically and mechanically connecting together the respective at least five pads of said first electronic component and the at least five pads of said second electronic component; wherein:

the ratios of the surface areas of the at least five pads of at least one of said first and second electronic components to the volumes of the respective metallic bonding elements vary stepwise in at least one direction from said central portion toward at least one of said outer peripheral edges; and each of the pads of said first and second electronic components is bonded to an associated metallic bonding element over the substantially whole area of the pad, whereby the shapes of the metallic bonding elements connected to the successive pads are different.

2. An electronic component unit according to claim 1, wherein the surface areas of said successive pads of said at least one of said electronic components vary stepwise in said at least one direction, and the volumes of the metallic bonding elements are substantially the same.

3. An electronic component unit according to claim 2, wherein the areas of said successive pads increase stepwise in said at least one direction.

4. An electronic component unit according to claim 2, wherein the areas of said successive pads decrease stepwise in said at least one direction.

5. An electronic component unit according to claim 1, wherein the surface areas of said successive pads of said at least one of said electronic components are substantially the same, and the volumes of the metallic bonding elements connected to said at least one of said electronic components is different from the volume of the metallic bonding element connected to said other pad successive pads vary stepwise in said at least one direction.

6. An electronic component unit according to claim 1, wherein said first electronic component is a semiconductor package comprising a substrate and a semiconductor chip, said substrate having first and second surfaces, with said at least five pads being provided on said first surface, and said semiconductor chip being mounted on said second surface; and said second electronic component is a circuit substrate.

7. An electronic component unit according to claim 1, wherein said first electronic component is a semiconductor chip, and said second electronic component is a substrate.

8. An electronic component unit according to claim 1, wherein the intervals between said pads vary in said at least one direction.

9. An electronic component unit according to claim 1, wherein each of said metallic bonding elements comprises a solder material containing at least one metal selected from the group consisting of PB, Sn, Au, In and Sb.

10. An electronic component unit according to claim 9, wherein the metallic bonding element connected to said one pad comprises a solder material having a melting point different from that of the solder material of the metallic bonding elements connected to said successive pads.

11. An electronic component unit according to claim 1, wherein each of said pads comprises at least one of a Ni layer and an Au layer.

12. An electronic component unit according to claim 1, wherein said at least five pads are respectively arranged at intersections of phantom longitudinal and lateral lines which form a lattice pattern.

13. An electronic component unit according to claim 12, wherein the ratios of the surface areas of said successive pads to the volumes of said respective metallic bonding elements increase stepwise in said at least one direction.

14. An electronic component unit according to claim 12, wherein the ratios of the surface areas of said successive pads to the volumes of said respective metallic bonding elements decrease stepwise in said at least one direction.

15. An electronic component unit according to claim 12, wherein the intervals between said pads vary in said at least one direction.

16. An electronic component unit according to claim 1, wherein the surface areas of each of said at least five electrode pads on said first electronic component are substantially the same as the surface areas of the respective electrode pads disposed on said second electronic component.

17. An electronic component comprising a first electronic component member having an internal electric circuit therein and adapted to be electrically and mechanically connected to another electronic component member through metallic bonding elements, said first electronic component member having a surface adapted to be connected to said another electronic component member, and at least five electrode pads disposed on said surface and electrically connected to said internal electric circuit; wherein:

each of said at least five electrode pads has a surface having a property of being wetted with a molten metal of said metallic bonding elements;

said at least five electrode pads are adapted to be electrically and mechanically connected to said another electronic component through said metallic bonding elements;

one of said at least five pads is disposed adjacent a center of said surface, two of said at least five pads are disposed adjacent opposite outer edges of said surface, and the remainder of said at least five pads are successively disposed between said two of said at least five pads; and the ratios of the surface areas of the successive pads to the volumes of the respective metallic bonding elements vary stepwise in at least one direction from said central portion toward at least one of said outer edges.

18. An electronic component according to claim 17, wherein the surface areas of said successive pads vary stepwise in said at least one direction.

19. An electronic component according to claim 18, wherein the surface areas of said successive pads increase stepwise in said at least one direction.

20. An electronic component according to claim 18, wherein the surface areas of said successive pads decrease stepwise in said at least one direction.

21. An electronic component according to claim 17, wherein each of said pads has at least one of a Ni layer and an Au layer.

22. An electronic component according to claim 17, wherein said at least five pads are respectively disposed on intersections of phantom longitudinal and lateral lines which form a lattice pattern, and the intervals between said successive pads change in said at least one direction.

23. An electronic component assembly comprising:

an electronic component having an internal electric circuit therein:

at least five electrode pads electrically connected to said internal electric circuit and provided on a surface of said electronic component so as to be connected to another electronic component, one of said at least five pads being disposed adjacent a center of said surface, two of said at least five pads being disposed adjacent opposite outer edges of said surface, and the remainder of said at least five pads being successively disposed between said two of said at least five pads; and at least five metallic bonding elements respectively disposed on said at least five pads to form bumps; wherein:

said at least five pads have surfaces having a property of being wetted with a molten metal of the metallic bonding elements;

the ratios of the surface areas of the at least five pads to the volumes of the respective metallic bonding elements vary stepwise in at least one direction from said center of said surface toward at least one of said outer edges.

24. An electronic component assembly according to claim 23, wherein said electronic component is a semiconductor package comprising a substrate and a semiconductor chip, said substrate having first and second surfaces, said at least five pads being provided on said first surface, and said semiconductor chip being provided on said second surface.

25. An electronic component assembly according to claim 23, wherein said electronic component is a semiconductor chip, and said at least five pads are provided on a surface of said chip.

26. An electronic component assembly according to claim 23, wherein said electronic component is a substrate, and said at least five pads are provided on a surface of said substrate.

27. An electronic component assembly according to claim 23, wherein the surface areas of said successive pads vary stepwise in said at least one direction.

28. An electronic component assembly according to claim 27, wherein the volumes of the metallic bonding elements connected to said successive pads are substantially the same.

29. An electronic component assembly according to claim 28, wherein the surface areas of said successive pads increase stepwise in said at least one direction.

30. An electronic component assembly according to claim 28, wherein the surface areas of said successive pads decrease stepwise in said at least one direction.

31. An electronic component assembly according to claim 23, wherein the intervals between said pads vary.

32. An electronic component assembly according to claim 23, wherein each of said metallic bonding elements comprises a solder material containing at least one metal selected from the group consisting of Pb, Sn, Au, In and Sb.

33. An electronic component assembly according to claim 32, wherein the metallic bonding material connected to said one pad comprises a solder material having a melting point different from that of the solder material of the metallic bonding elements connected to said other pads.

34. An electronic component assembly according to claim 23, wherein each of said electrode pads has at least one of a Ni layer and a Au layer.

35. An electronic component assembly according to claim 23, wherein said at least five pads are respectively disposed at intersections of phantom longitudinal and lateral lines which form a lattice form.

36. An electronic component assembly according to claim 35, wherein the ratios of the surface areas of said successive pads to the volumes of said respective metallic bonding elements increase stepwise in said at least one direction.

37. An electronic component assembly according to claim 35, wherein the ratios of the surface areas of said successive pads to the volumes of said respective metallic bonding elements decrease stepwise in said at least one direction.

38. An electronic component assembly according to claim 35, wherein the intervals between said successive pads change in said at least one direction.

* * * * *